US008810335B2

(12) United States Patent
Ichihara

(10) Patent No.: US 8,810,335 B2
(45) Date of Patent: Aug. 19, 2014

(54) NOISE FILTER

(71) Applicant: Masafumi Ichihara, Chiyoda-ku (JP)

(72) Inventor: Masafumi Ichihara, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/003,593

(22) PCT Filed: Nov. 8, 2012

(86) PCT No.: PCT/JP2012/079018
§ 371 (c)(1),
(2), (4) Date: Sep. 6, 2013

(87) PCT Pub. No.: WO2014/073077
PCT Pub. Date: May 15, 2014

(65) Prior Publication Data
US 2014/0125430 A1    May 8, 2014

(51) Int. Cl.
*H03H 7/09* (2006.01)
*H03H 1/00* (2006.01)
*H01F 3/00* (2006.01)

(52) U.S. Cl.
CPC ............... *H03H 7/09* (2013.01); *H03H 1/0007* (2013.01); *H01F 3/00* (2013.01)
USPC .......................................... 333/177; 333/181

(58) Field of Classification Search
CPC ..... H03H 1/0007; H03H 7/0115; H03H 7/09; H03H 2001/0035; H03H 2001/0092; H01F 3/00; H01F 3/10
USPC ................................... 333/12, 177, 181, 185
See application file for complete search history.

(56) References Cited

U.S. PATENT DOCUMENTS

| 1,788,152 | A | | 1/1931 | Dowling | |
|---|---|---|---|---|---|
| 4,910,482 | A | * | 3/1990 | Takagai et al. | 333/181 |
| 5,731,666 | A | * | 3/1998 | Folker et al. | 315/276 |

FOREIGN PATENT DOCUMENTS

| EP | 2 088 603 A2 | 8/2009 |
|---|---|---|
| JP | 38-15856 B1 | 8/1963 |
| JP | 38-26931 Y1 | 12/1963 |
| JP | 60-81630 U | 6/1985 |
| JP | 1-115223 U | 8/1989 |
| JP | 4-254307 A | 9/1992 |

(Continued)

OTHER PUBLICATIONS

International Search Report for PCT/JP2012/079018 dated Feb. 19, 2013.

(Continued)

*Primary Examiner* — Benny Lee
*Assistant Examiner* — Rakesh Patel
(74) *Attorney, Agent, or Firm* — Sughrue Mion, PLLC; Richard C. Turner

(57) ABSTRACT

A noise filter includes a first magnetic core that includes a plurality of leg portions, and a first connection portion and a second connection portion, which connect both ends of the leg portions, a plurality of coils that are wound on the leg portions, respectively, and a second magnetic core that is configured to be attachable to and detachable from the first magnetic core such that a closed magnetic path, which intersects with each of the first connection portion and the second connection portion and which passes through the leg portions, is formed, in which the first magnetic core includes a normal mode inductance, and the closed magnetic path includes a common mode inductance.

4 Claims, 13 Drawing Sheets

(56) References Cited

FOREIGN PATENT DOCUMENTS

| | | |
|---|---|---|
| JP | 2001-110654 A | 4/2001 |
| JP | 2001-197665 A | 7/2001 |
| JP | 2006-319176 A | 11/2006 |
| JP | 2007-48897 A | 2/2007 |

OTHER PUBLICATIONS

German Office Action dated Jan. 31, 2014 issued in German Application No. 11 2012 001 304.2.

German Office Action dated Jun. 27, 2014 issued in German Application No. 11 2012 001 304.2.

\* cited by examiner

RELATED ART

RELATED ART

NOISE FILTER

CROSS REFERENCE TO RELATED APPLICATIONS

This application is a National Stage of International Application No. PCT/JP2012/079018 filed Nov. 8, 2012, the contents of which are incorporated herein by reference in their entirety.

FIELD

The present invention relates to a noise filter.

BACKGROUND

Patent Literature 1 discloses a choke coil installed between a power converter and a power system, in which, in a core in which the upper ends and lower ends of three leg portions are connected to each other by using two connection portions, coils are wound on the three leg portions and a yoke is connected between parts of the two connection portions, which extend toward the right side. With this structure, according to Patent Literature 1, it is described that it is possible to obtain a choke coil that can maintain a predetermined inductance value for both the normal mode and the common mode.

CITATION LIST

Patent Literature

Patent Literature 1: Japanese Patent Application Laid-open 2007-48897

SUMMARY

Technical Problem

Meanwhile, it tends to be difficult to estimate the effect of common mode noise until it is evaluated at the site where the device targeted for noise reduction is installed. Therefore, in order to take an appropriate countermeasure against noise, the common mode inductance value has to be adjusted by trial and error. In this case, it is assumed that the common mode inductance value needs to be changed many times during the adjustment.

The technology in Patent Literature 1 describes that it is satisfactory to maintain a predetermined inductance value for both the normal mode and the common mode. Therefore, it is assumed with this technology that the yoke is connected to the core in advance. Thus, it is difficult for a user to change the common mode inductance value.

Moreover, in the technology described in Patent Literature 1, the two connection portions are extended toward the right side from the upper ends and lower ends of the three leg portions and the yoke is connected to the extended parts. Consequently, the size of the choke coil in the lateral direction becomes larger than the size corresponding to the three leg portions and therefore the size of the noise filter, which includes the choke coil, increases. Thus, the manufacturing cost of the noise filter may increase.

Moreover, in the technology described in Patent Literature 1, when it is finally determined that the chock coil is to be used, there may be a problem with the place of installation. Specifically, in a case where the chock coil is arranged in a narrow place, if it is necessary to change the installation direction and the dimension in a specific direction (lateral direction) is large, it is difficult to change the installation direction.

The present invention is achieved in view of the above and has an object to obtain a noise filter that can be adjusted by a user in accordance with the installation environment while suppressing an increase in the size of the noise filter.

Solution to Problem

In order to solve the above problems and achieve the object, a noise filter according to one aspect of the present invention includes a first magnetic core that includes a plurality of leg portions, and a first connection portion and a second connection portion, which connect both ends of the leg portions, a plurality of coils that are wound on the leg portions, respectively, and a second magnetic core that is configured to be attachable to and detachable from the first magnetic core such that a closed magnetic path, which intersects with each of the first connection portion and the second connection portion and which passes through the leg portions, is formed, in which the first magnetic core includes a normal mode inductance, and the closed magnetic path includes a common mode inductance.

Advantageous Effects of Invention

According to the present invention, it is possible to first install the reactor without the second magnetic core and then attach the second magnetic core if a problem occurs. Thus, taking an excessive countermeasure against the common mode can be suppressed, which enables a countermeasure to be easily taken if common mode noise becomes a problem due to a change in the surrounding environment. In other words, a user can easily adjust the noise filter in accordance with the installation environment. Moreover, the second magnetic core is attached to the first magnetic core in the thickness direction in which the first magnetic core has a dimensional margin. Therefore, when the noise filter is viewed as a whole, it is possible to suppress an increase in the size when the second magnetic core is attached to the first magnetic core. Thus, a user can adjust the noise filter in accordance with the installation environment while suppressing an increase in the size of the noise filter.

DESCRIPTION OF EMBODIMENTS

Embodiments of a noise filter according to the present invention will be described in detail below with reference to the drawings. This invention is not limited to these embodiments.

First Embodiment

Figure 1:
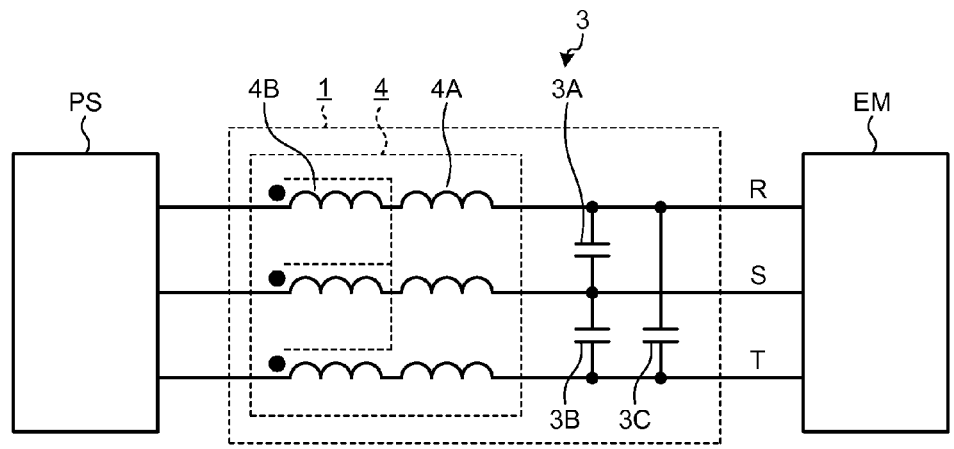
FIG. 1 is a diagram illustrating the configuration of a noise filter according to a first embodiment.

A noise filter 1 according to the first embodiment will be explained with reference to FIG. 1. FIG. 1 is a diagram illustrating the configuration of the noise filter 1 according to the first embodiment.

An electrical power machine (for example, power converter) EM, which performs an operation (for example, power conversion) when it receives power (for example, three-phase AC power: R phase, S phase, T phase) from a power system PS, includes, for example, a plurality of switching elements and performs power conversion by causing the switching elements to perform switching operations. At this point, because noise due to the switching operations of the switching elements is generated in the electrical power machine EM, the noise may be transmitted to the power system PS. If the noise is transmitted to the power system PS, the noise may also be transmitted to the devices connected to the power system same as the power system PS, and the devices may malfunction.

To counter this noise, the noise filter 1 is arranged between the power system PS and the electrical power machine EM, thereby suppressing noise that could be transmitted to the power system PS from the electrical power machine EM. For example, the noise filter 1 includes a capacitor 3 and a reactor 4. The capacitor 3, for example, includes three line-to-line capacitors 3A, 3B, and 3C that have the same capacitance. Each of the line-to-line capacitors 3A, 3B, and 3C suppresses normal mode noise.

In the configuration in FIG. 1, the noise that may be transmitted to the power system PS from the electrical power machine EM includes common mode noise as well as normal mode noise.

Therefore, it is necessary for the reactor 4 to include not only a normal mode inductance 4A for suppressing normal mode noise but also a common mode inductance 4B for suppressing common mode noise.

Figure 16:
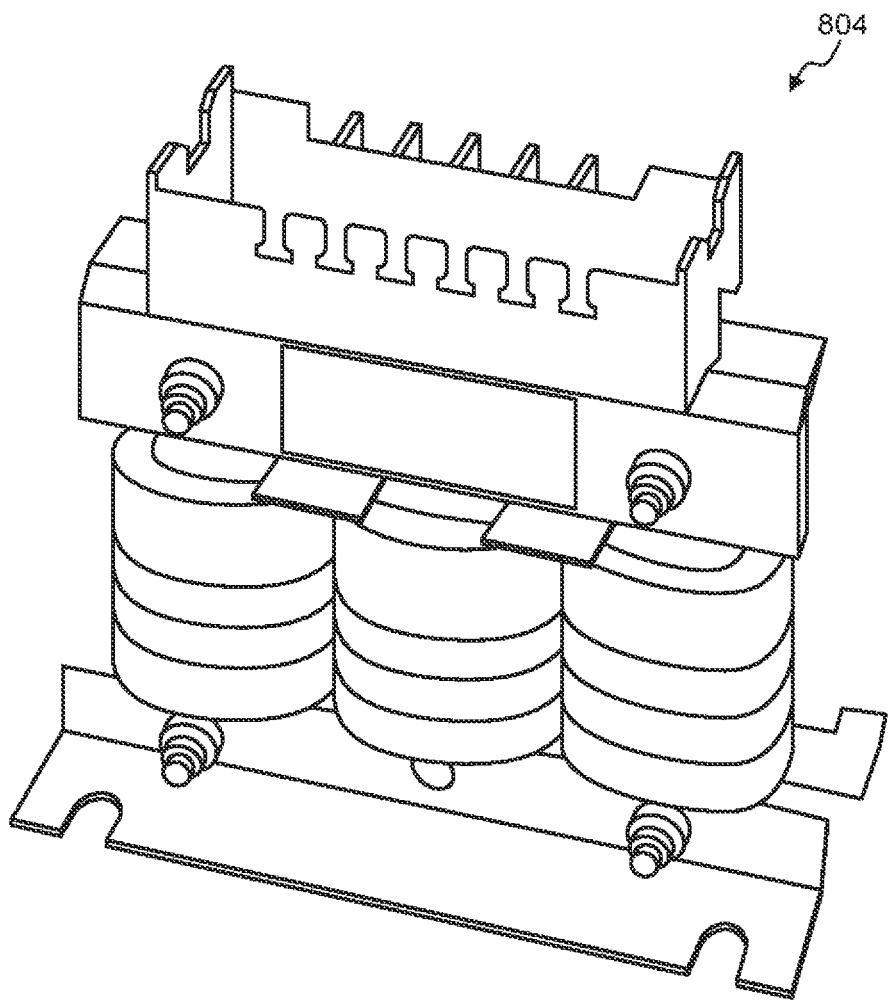
FIG. 16 is a diagram illustrating the configuration of a reactor according to a comparison example.
Figure 17:
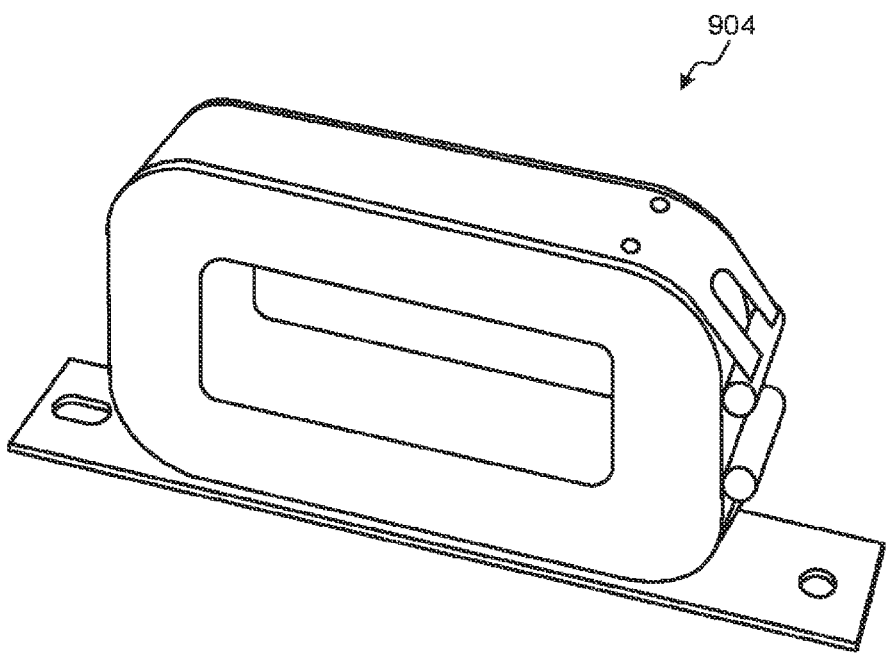
FIG. 17 is a diagram illustrating the configuration of a reactor according to another comparison example.

Meanwhile, as illustrated in FIG. 16, a typically used reactor is a normal mode reactor 804 and does not include a common mode inductance. When a common mode inductance is added as a countermeasure against noise or the like, it is considered that this is realized by adding a common mode reactor 904 as illustrated in FIG. 17.

However, in order to add the common mode reactor 904, it is necessary to attach and detach wiring at the place where the power system PS and the electrical power machine EM are installed; therefore, additions or changes are not easy.

Moreover, it tends to be difficult to estimate the effect of common mode noise until it is evaluated at the site where the device targeted for noise reduction is installed. For this reason, in order to take an appropriate countermeasure against noise, the common mode inductance value has to be adjusted by trial and error. In this case, it is assumed that the common mode inductance value needs to be changed many times during the adjustment. Furthermore, because the common mode reactor can have various characteristics depending on the core material and the coil configuration (number of passages), trial and error needs to be performed many times to find an appropriate combination as a countermeasure against noise.

If the reactor 4 in the noise filter 1 is configured by adding the common mode reactor 904 (see FIG. 17) to the normal mode reactor 804 (see FIG. 16), in most trial-and-error approaches, the common mode reactors 904 for the types of the common mode inductance value need to be prepared and the reactor 4 needs to be rewired each time; therefore, the time and cost of adjustments of the reactor 4 may increase.

Moreover, when it is finally determined that the reactor 4 is to be used, there may be a problem with the place of installation. For example, at the place where the power system PS and the electrical power machine EM are installed, if the place where the reactor 4 is to be installed is narrow, when the method of adding the common mode reactor 904 (see FIG. 17) to the normal mode reactor 804 (see FIG. 16) is applied, the overall size of the reactor 4 increases and it becomes difficult to arrange the reactor 4 in the place where the reactor 4 is to be installed.

Figure 2:
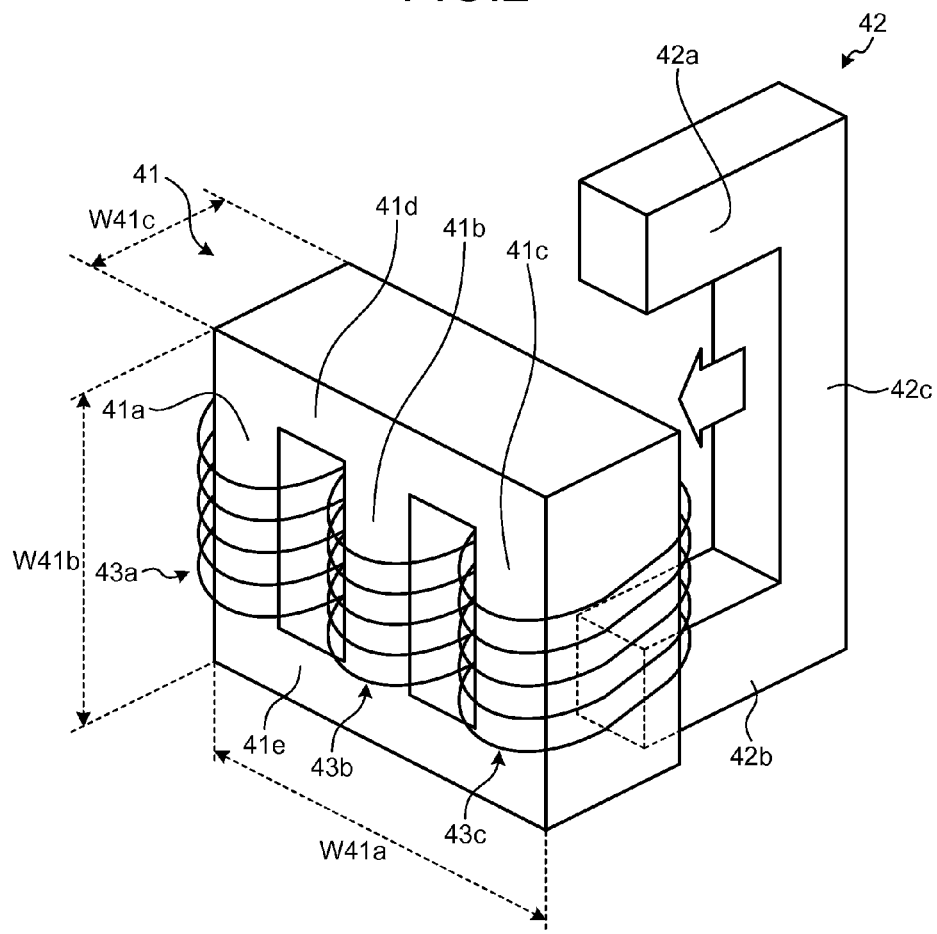
FIG. 2 is a diagram illustrating the configuration of a reactor according to the first embodiment.

Thus, in the first embodiment, in the reactor 4 of the noise filter 1, as illustrated in FIG. 2, a second magnetic core 42 is configured to be attachable to and detachable from an n-leg-core (n>1) type first magnetic core 41. Therefore, an increase in the size of the noise filter 1 can be suppressed while the common mode inductance 4B is included in the reactor 4 in addition to the normal mode inductance 4A and moreover, a user can adjust the noise filter 1 such that the noise reduction effect increases.

Specifically, the reactor 4 of the noise filter 1 includes the first magnetic core 41, a plurality of coils 43a to 43c, and the second magnetic core 42.

The first magnetic core 41 includes a plurality of leg portions 41a to 41c, a first connection portion 41d, and a second connection portion 41e. The leg portions 41a to 41c are arranged side by side (for example, parallel to each other) such that they are spaced apart from each other. The leg portions 41a to 41c, for example, correspond to the phases of the power supplied to the electrical power machine EM from the power system PS. For example, the leg portions 41a to 41c correspond to the R phase, S phase, and T phase, respectively. For example, the leg portion 41a corresponds to the R phase.

FIG. 2 exemplifies a three-phase reactor as the reactor 4; however, even if the number of phases is different, the reactor 4 can be configured in a similar manner.

The first connection portion 41d connects one end of the leg portion 41a, one end of the leg portion 41b, and one end of the leg portion 41c (end parts on the upper side in FIG. 2). The second connection portion 41e connects the other ends (end parts on the lower side in FIG. 2) of the leg portions 41a to 41c. In other words, the first connection portion 41d and the second connection portion 41e connect both ends of the leg portions 41a to 41c.

Each of the coils 43a to 43c is wound on a leg portion. For example, the coil 43a is wound on the leg portion 41a, the coil 43b is wound on the leg portion 41b, and the coil 43c is wound on the leg portion 41c. The coils 43a to 43c, for example, correspond to the phases of the power supplied to the electrical power machine EM from the power system PS. For example, the coils 43a to 43c correspond to the R phase, S phase, and T phase, respectively. For example, the coil 43a corresponds to the R phase.

Figure 3:
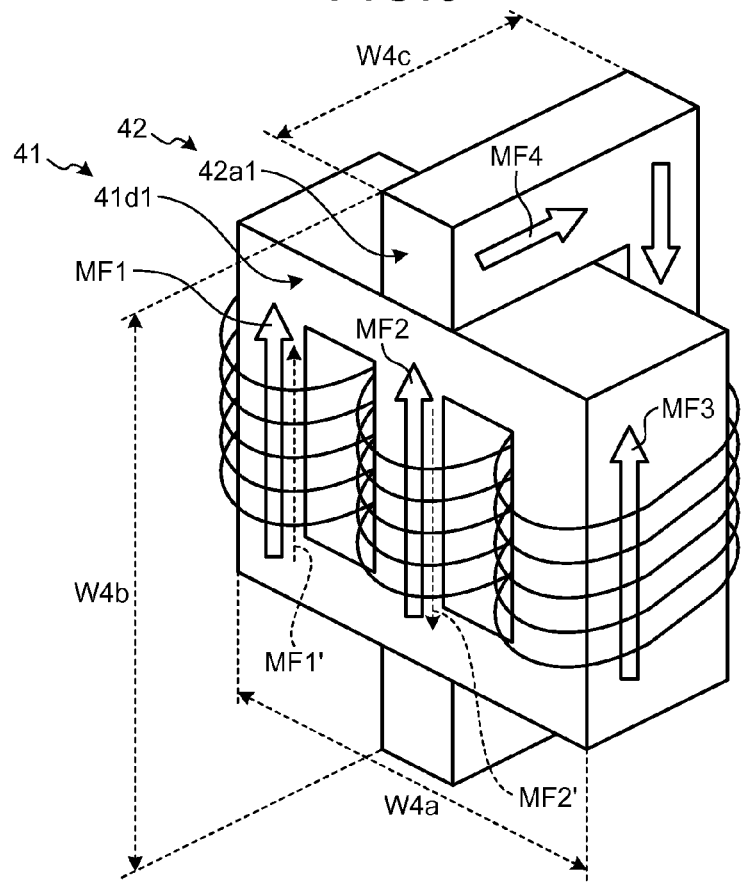
FIG. 3 is a diagram illustrating the configuration of the reactor according to the first embodiment.

As illustrated in FIG. 2 and FIG. 3, the second magnetic core 42, for example, has a substantially C shape and is configured such that it can be attached to and detached from the first magnetic core 41. The second magnetic core 42 includes a plurality of arm portions 42a and 42b and a connection portion 42c. The arm portions 42a and 42b are arranged side by side (for example, parallel to each other) such that they are spaced apart from each other. The arm portions 42a and 42b are, for example, arranged to be spaced apart from each other by an interval corresponding to the first magnetic core 41 in the direction along the leg portion 41b. Each of the arm portions 42a and 42b, for example, has a length (for example, a length slightly longer than the width of the first magnetic core 41) corresponding to the width of the first magnetic core 41 in the direction (hereinafter, referred to as the thickness direction) orthogonal to the direction in which the leg portions 41a to 41c are arranged and to the direction along each of the leg portions 41a to 41c.

The connection portion 42c connects one end of the arm portion 42a and one end of the arm portion 42b (end parts on the right side in FIGS. 2 and 3). Consequently, the second magnetic core 42 is, for example, formed into a substantially C shape.

The second magnetic core 42 is, for example, attached to the first magnetic core 41 such that it sandwiches the leg portion 41b, the first connection portion 41d, and the second connection portion 41e from both outer sides. In other words, the second magnetic core 42 is attached to the first magnetic core 41 in the thickness direction.

The first magnetic core 41 is such that a dimension W41a in the direction in which the leg portions 41a to 41c are arranged and a dimension W41b in the direction along each of the leg portions 41a to 41c are each longer than a dimension W41c in the thickness direction. In other words, the first magnetic core 41 has a dimensional margin in the thickness direction compared with that in the other directions. Therefore, when the second magnetic core 42 is attached to the first magnetic core 41 in the thickness direction, as illustrated in FIG. 3, in the reactor 4, it is possible to suppress a dimension W4a in the direction in which the leg portions 41a to 41c are arranged, a dimension W4b in the direction along each of the leg portions 41a to 41c, and a dimension W4c in the thickness direction to the same degree as the dimensions W41a and W41b.

Figure 4:
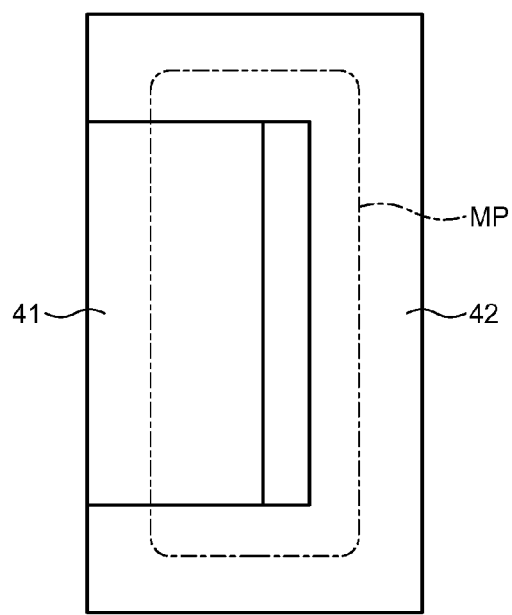
FIG. 4 is a diagram illustrating the configuration of the reactor according to the first embodiment.

When the reactor 4, in which the second magnetic core 42 is attached to the first magnetic core 41 as described above, is viewed in a cross section taken normal to the direction in which the leg portions 41a to 41c are arranged, a closed magnetic path MP is formed as indicated by the dashed-dotted line in FIG. 4. In other words, in the reactor 4, the second magnetic core 42 is attached to the first magnetic core 41 such that the closed magnetic path MP, which intersects with each of the first connection portion 41d and the second connection portion 41e and which passes through the leg portion 41b (see FIG. 2), which is one of the leg portions 41a to 41c, is formed.

For example, in the reactor 4, when normal mode noise flows in the coils 43a to 43c, in the first magnetic core 41, for example, a magnetic flux MF1' and a magnetic flux MF2', which are in opposite directions and are indicated by the dashed arrows in FIG. 3, are generated in the leg portion 41a and the leg portion 41b, respectively. The magnetic flux MF1' and the magnetic flux MF2' flow in the closed magnetic path that passes through the first connection portion 41d, the leg portion 41b, and the second connection portion 41e starting from the leg portion 41a and returns to the leg portion 41a. In other words, the first magnetic core 41 has a closed magnetic path for normal mode noise and therefore can function as an inductance for normal mode noise. Thus, the first magnetic core 41 includes the normal mode inductance 4A.

However, in the reactor 4, when common mode noise flows in the coils 43a to 43c, in the first magnetic core 41, for example, magnetic fluxes MF1 to MF3, which are in the same direction and are indicated by the white arrows, are generated in the leg portions 41a to 41c, respectively. Because the magnetic fluxes MF1 to MF3 are directed in the same direction, it is difficult to form a closed magnetic path in the first magnetic core 41. In other words, the first magnetic core 41 does not have a closed magnetic path for common mode noise and is difficult to function as an inductance for common mode noise. Thus, the first magnetic core 41 does not substantially include the common mode inductance 4B.

In contrast, when the second magnetic core 42 is attached to the first magnetic core 41 that does not have a closed magnetic path for common mode noise, a magnetic flux MF4, which is obtained by synthesizing the magnetic fluxes MF1 to MF3 generated when common mode noise flows in the coils 43a to 43c, flows in the second magnetic core 42. Therefore, the reactor 4 can have the common mode inductance 4B in addition to the normal mode inductance 4A, which is originally included in the reactor 4.

Specifically, in the reactor 4, the second magnetic core 42 is attached to the first magnetic core 41 such that the closed magnetic path MP, which intersects with each of the first connection portion 41d and the second connection portion 41e and which passes through the leg portion 41b, which is one of the leg portions 41a to 41c, is formed. Consequently, when the second magnetic core 42 is attached to the first magnetic core 41, the magnetic fluxes MF1 to MF3, which are generated in the leg portions 41a to 41c of the first magnetic core 41 due to the common mode noise flowing in the coils 43a to 43c, flows in the closed magnetic path MP. In other words, the closed magnetic path MP is a closed magnetic path for common mode noise and can function as an inductance for common mode noise. Thus, the reactor 4 includes the common mode inductance 4B.

Next, an explanation will be made of the advantages in configuring the second magnetic core 42 to be attachable to and detachable from the first magnetic core 41.

For example, it tends to be difficult to estimate the effect of normal mode noise and common mode noise until it is evaluated at the site where the device targeted for noise reduction is installed. For example, a noise problem does not always occur depending on the environment of the place where the power system PS and the electrical power machine EM are installed; therefore, in terms of the cost and workload, it is difficult to provide the reactor 4 with the common mode inductance 4B from the beginning before the power system PS and the electrical power machine EM are installed. Moreover, without determining how much the common mode inductance 4B needs to be inserted into the reactor 4, excessive countermeasure or insufficient countermeasure may be taken.

In contrast, in the case where the reactor 4 is not provided with the common mode inductance 4B on the assumption that it is not necessary to take a countermeasure against noise, if an unexpected noise problem or a delayed noise problem occurs while the power system PS and the electrical power machine EM are in operation and a countermeasure against noise is needed, the common mode inductance 4B needs to be added to the reactor 4.

At this time, if the reactor 4 in the noise filter 1 is configured by adding the common mode reactor 904 (see FIG. 17) to the normal mode reactor 804 (see FIG. 16), it is necessary to perform the operation of preparing the whole common mode reactor 904 and rewiring the reactor 4, which imposes a burden in terms of the cost and workload.

In contrast, in the first embodiment, it is possible to first install the reactor 4 without the second magnetic core 42 and, when a countermeasure against noise is needed, attach an appropriate second magnetic core 42. Therefore, these problems are solved.

At this time, as described above, in order to take an appropriate countermeasure against noise, the common mode inductance value needs to be adjusted by trial and error; therefore, a plurality of second magnetic cores 42, 42', and 42", any of which have characteristics (for example, frequency characteristics and inductance value) different from each other, are prepared as a candidate for the second magnetic core 42.

Figure 5:
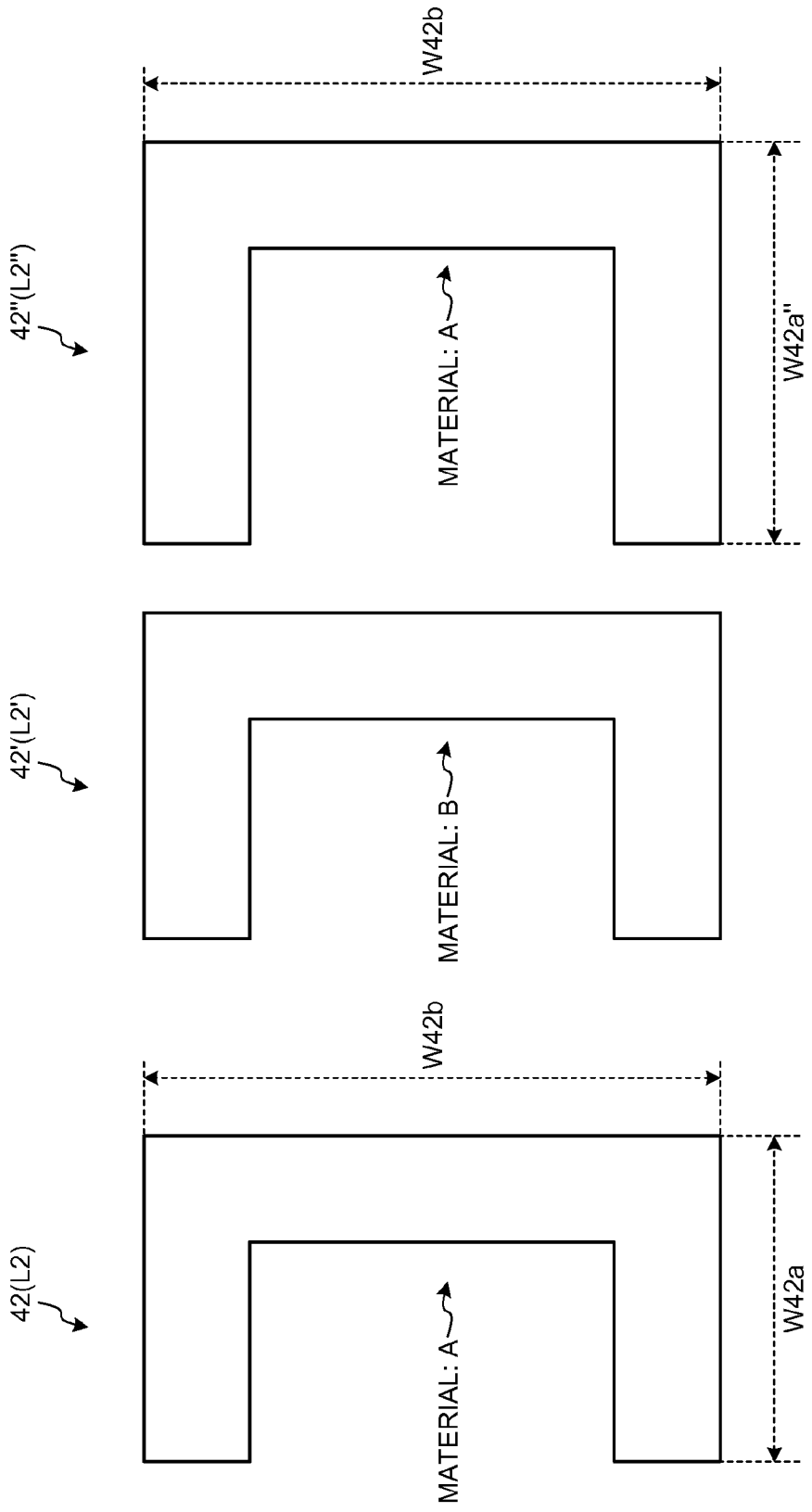
FIG. 5 is a diagram illustrating the configurations of second magnetic cores according to the first embodiment.

For example, as illustrated in FIG. 5, if any of the second magnetic cores 42, 42', and 42" are made of a material different from the others, a common mode inductance in accordance with the required characteristics can be obtained. For example, in the case where the second magnetic core 42 is made of the material A and the second magnetic core 42' is made of the material B, even if the second magnetic core 42 and the second magnetic core 42' have the same size, when the closed magnetic path MP is formed, different inductance values L2 and L2' can be obtained. For example, if silicon steel is used as the material A, common mode noise having low frequency and large amplitude can be suppressed, and if a material having excellent frequency characteristics, such as ferrite, is used as the material B, common mode noise having a high frequency, such as noise, can be suppressed. In other words, the common mode inductance L2 corresponding to the second magnetic core 42 and the common mode inductance L2" corresponding to the second magnetic core 42" may be close in value; however, the frequency characteristics are different from each other. It is obvious that the inductance values may be made different from each other by changing the materials.

The first magnetic core 41 may be made of, for example, the material A, the material B, or a material different from the material A and the material B.

Alternatively, for example, as illustrated in FIG. 5, if any of the second magnetic cores 42, 42', and 42" have a size different from the others, a common mode inductance in accordance with the required characteristics can be obtained. For example, when the dimensions of the second magnetic cores 42 and 42" in the direction along the connection portion 42c are the same, i.e., W42b, and the dimensions of the second magnetic cores 42 and 42" in the direction along the arm portion 42b are different from each other, i.e., W42a and W42a", even if the second magnetic cores 42 and 42" are made of the same material, i.e., the material A, when the closed magnetic path MP is formed, different inductance values L2 and L2" can be obtained. In other words, in terms of the common mode inductance L2 corresponding to the second magnetic core 42 and the common mode inductance L2" corresponding to the second magnetic core 42", when the closed magnetic path MP is formed, the length of the closed magnetic path MP is different; therefore, for example, even if the frequency characteristics are similar, the inductance values when the closed magnetic path MP is formed are different from each other (for example, L2>L2").

Both the material and the dimension of any of the second magnetic cores 42, 42', and 42" may be different from the others.

In this manner, a countermeasure against common mode noise can be easily taken by selecting an appropriate magnetic core from the second magnetic cores 42, 42', and 42" in accordance with the noise problem on site.

As described above, in the first embodiment, in the noise filter 1, the second magnetic core 42 is configured to be attachable to and detachable from the first magnetic core 41 such that the closed magnetic path MP, which intersects with each of the first connection portion 41d and the second connection portion 41e and which passes through the leg portions 41a to 41c, is formed. Consequently, when it is difficult to estimate the adverse effect of common mode noise until it is evaluated at the site, a countermeasure can be taken by attaching the second magnetic core 42 to the first magnetic core 41 later. Therefore, for example, it is possible to first install the reactor 4 without the second magnetic core 42 and then attach the second magnetic core 42 if a problem occurs. Thus, taking an excessive countermeasure against the common mode can be suppressed, which enables a countermeasure to be easily taken if common mode noise becomes a problem due to a change in the surrounding environment. In other words, a user can easily adjust the noise filter 1 in accordance with the installation environment.

Moreover, in the first embodiment, in the noise filter 1, the second magnetic core 42 is attached to the first magnetic core 41 in the thickness direction in which the first magnetic core 41 has a dimensional margin. Therefore, when the noise filter 1 is viewed as a whole, it is possible to suppress an increase in the size when the second magnetic core 42 is attached to the first magnetic core 41. For example, in the reactor 4, it is possible to suppress the dimension W4a in the direction in which the leg portions 41a to 41c are arranged, the dimension W4b in the direction along each of the leg portions 41a to 41c, and the dimension W4c in the thickness direction to the same degree as the dimensions W41a and W41b (see FIG. 3). Consequently, an increase in the size of the noise filter can be suppressed. Moreover, because the dimensions in the respective directions can be made similar, when the noise filter is installed in a narrow place, if it is necessary to change the installation direction, the installation direction can be changed easily.

Therefore, according to the first embodiment, a user can adjust the noise filter 1 in accordance with the installation environment while suppressing an increase in the size of the noise filter.

Moreover, in the first embodiment, the second magnetic core 42 is selected from the second magnetic cores 42, 42', and 42", any of which have different characteristics. Therefore, when it is difficult to estimate the adverse effect of common mode noise until it is evaluated at the site, a user can change the common mode inductance value. Thus, the common mode inductance value can be adjusted by trial and error. As a result, it is possible to take an appropriate countermeasure against noise in an unexpected environment or a change in the environment that develops later.

The noise filter 1 may be configured such that the capacitor 3 is omitted. Even in such a case, normal mode noise and common mode noise can be suppressed by the reactor 4.

Moreover, FIGS. 2 and 3 exemplify a case where the position at which the second magnetic core 42 is attached to the first magnetic core 41 is a position corresponding to the center line of symmetry of the first magnetic core 41 and is a balanced position with respect to the three phases. However, for example, when the effect of noise is different between the three phases, it is considered preferable in some cases to attach the second magnetic core 42 to the first magnetic core 41 at an unbalanced position with respect to the three phases. In such a case, the second magnetic core 42 may be attached to the first magnetic core 41 at a position that is asymmetric with respect to the first magnetic core 41. For example, the second magnetic core 42 may be attached to the first magnetic core 41 at a position corresponding to the leg portion 41a of the first magnetic core 41 or the second magnetic core 42 may be attached to the first magnetic core 41 at a position corresponding to the leg portion 41c of the first magnetic core 41.

Figure 6:
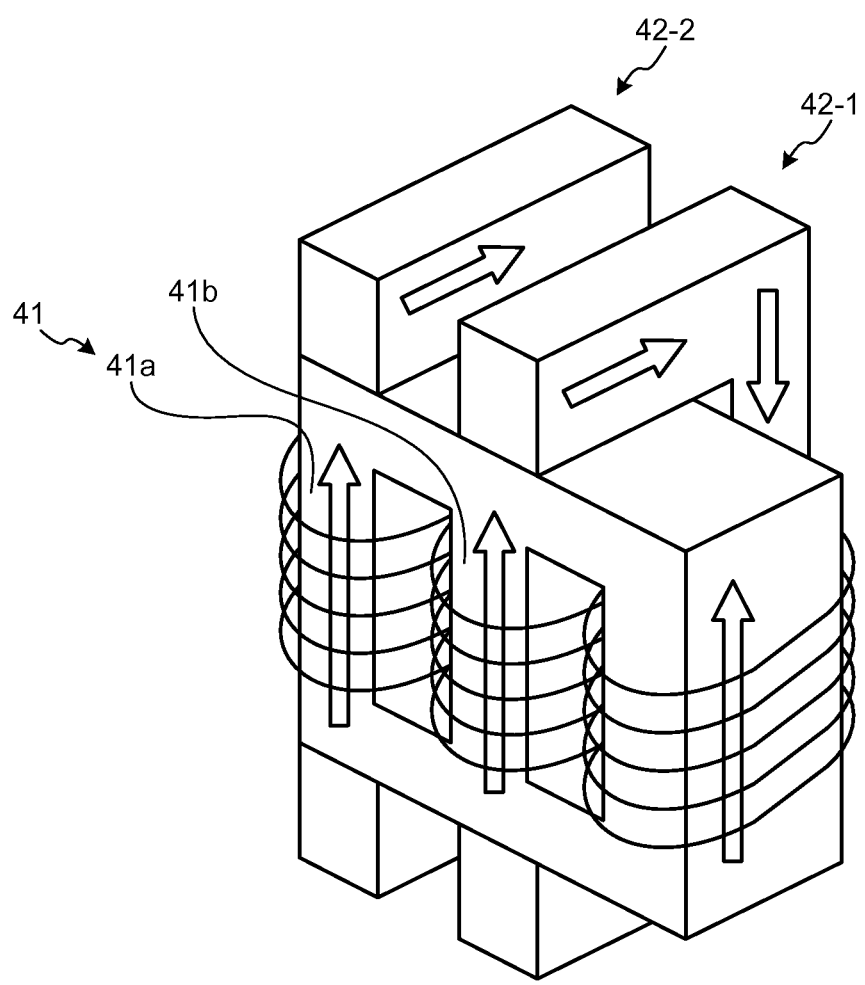
FIG. 6 is a diagram illustrating the configuration of a reactor according to a modification example of the first embodiment.

Moreover, for example, as illustrated in FIG. 6, a plurality of second magnetic cores 42-1 and 42-2 may be attached to the first magnetic core 41. For example, the second magnetic core 42-1 may be attached to the first magnetic core 41 at a position corresponding to the leg portion 41b of the first magnetic core 41 and the second magnetic core 42-2 may be attached to the first magnetic core 41 at a position corresponding to the leg portion 41a of the first magnetic core 41. Consequently, a wide adjustment range of the common mode inductance value can be maintained compared with the case where the common mode inductance value is adjusted by using one second magnetic core 42.

Second Embodiment

Figure 7:
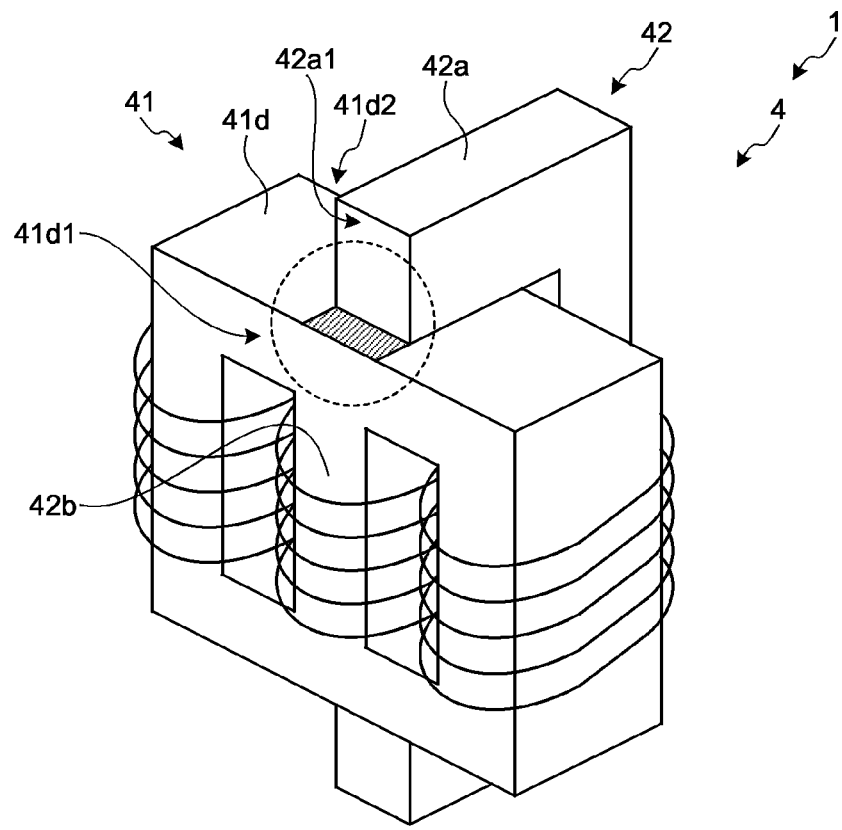
FIG. 7 is a diagram illustrating the configuration of a reactor according to a second embodiment.
Figure 8:
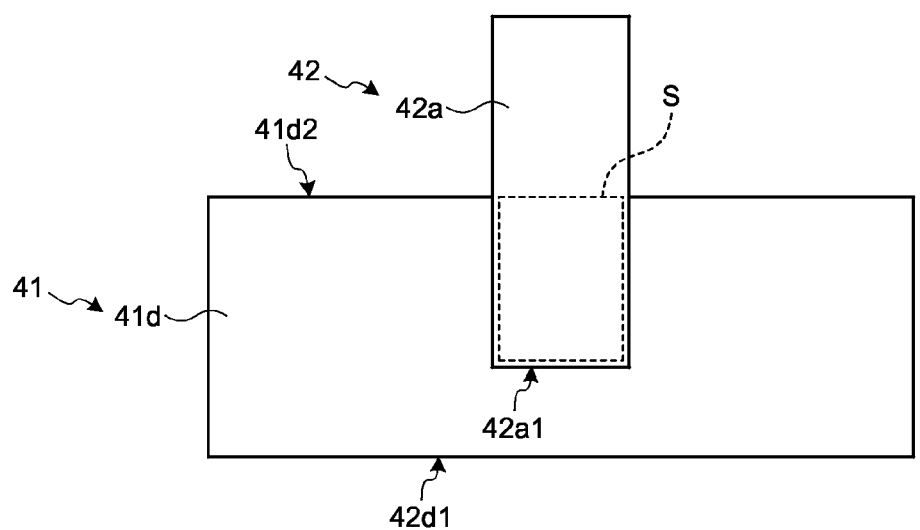
FIG. 8 is a diagram illustrating the configuration of the reactor according to the second embodiment.

Next, the noise filter 1 according to the second embodiment will be explained with reference to FIG. 7 and FIG. 8. FIG. 7 and FIG. 8 are diagrams illustrating the configuration of the reactor 4 according to the second embodiment. In the following, the explanation concentrates on the portions that are different from the first embodiment.

In the first embodiment, the second magnetic core 42 is attached to the first magnetic core 41 such that an end surface 42a1 of the second magnetic core 42 and a side surface 41d1 of the first magnetic core 41 are flush (see FIG. 3). In contrast, in the second embodiment, the attachment position is adjusted such that the end surface 42a1 of the second magnetic core 42 is displaced from the position at which the end surface 42a1 and the side surface 41d1 of the first magnetic core 41 are flush.

Specifically, in the reactor 4 of the noise filter 1, as illustrated in FIG. 7 and FIG. 8, the end surface 42a1 of the arm portion 42a in the second magnetic core 42 is located toward the side of a side surface 41d2, which is opposite to the side surface 41d1 of the first connection portion 41d in the first magnetic core 41.

At this time, the overlapping area S of the first magnetic core 41 and the second magnetic core 42 when seen through in the longitudinal direction of the leg portion 41b changes depending on the position of the end surface 42a1 between the side surface 41d1 and the side surface 41d2. When the overlapping area S changes, the length of the closed magnetic path MP formed by the first magnetic core 41 and the second magnetic core 42 changes and the cross-sectional area of the overlapping portion of the first magnetic core 41 and the second magnetic core 42 partially changes; therefore, the common mode inductance value of the closed magnetic path MP changes. In other words, the common mode inductance value of the closed magnetic path MP can be adjusted by adjusting the overlapping area S.

For example, when the overlapping area S is increased, the common mode inductance value increases and saturation becomes easy to occur. Alternatively, for example, when the overlapping area S is reduced, the common mode inductance value decreases and saturation becomes difficult to occur.

The inductance value and the saturation characteristics can be adjusted in accordance with the situation on site; therefore, it is possible to cope with the noise problem under more various conditions.

As described above, in the second embodiment, in the noise filter 1, the overlapping area S of the first magnetic core 41 and the second magnetic core 42 when seen through in the longitudinal direction of the leg portion 41b is adjusted such that the common mode inductance of the closed magnetic path MP becomes an appropriate value. Consequently, the common mode inductance value can be adjusted without replacing the second magnetic core 42 with one having different characteristics and fine adjustment of the common mode inductance value can be easily performed.

Third Embodiment

Figure 9:
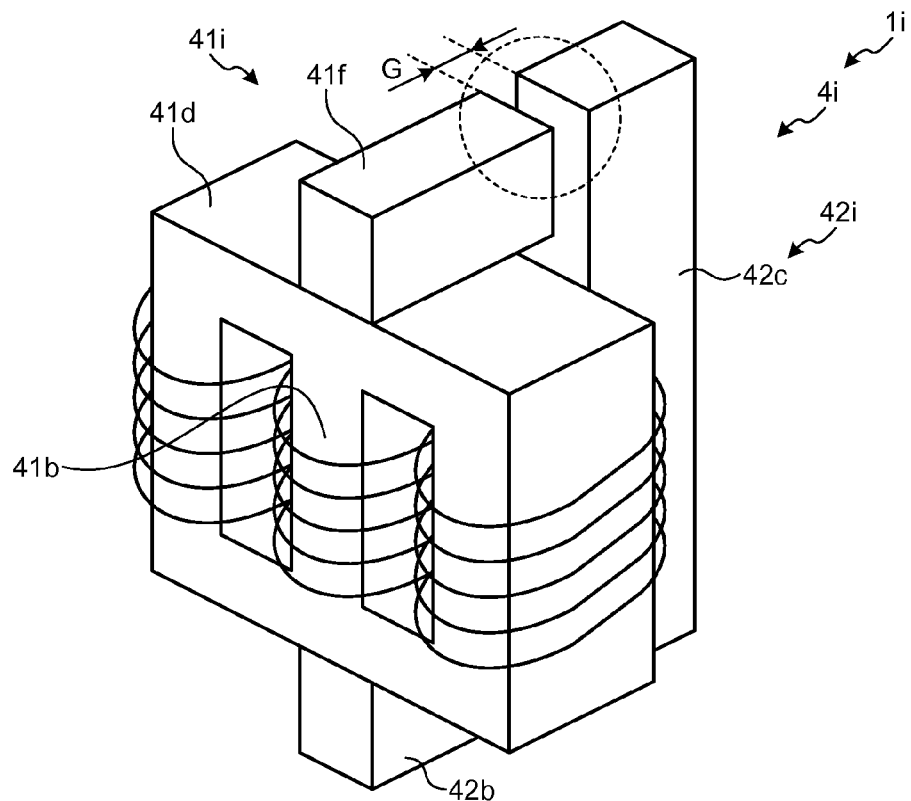
FIG. 9 is a diagram illustrating the configuration of a reactor according to a third embodiment.
Figure 10:
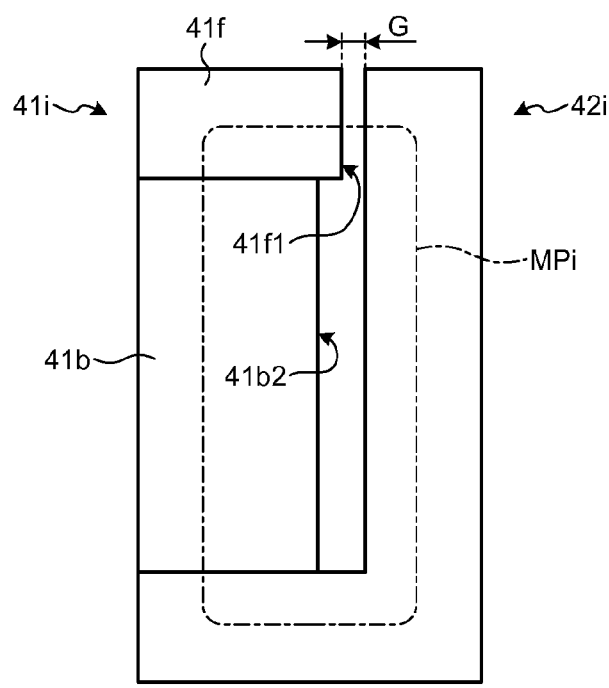
FIG. 10 is a diagram illustrating the configuration of the reactor according to the third embodiment.

Next, a noise filter 1i according to the third embodiment will be explained with reference to FIG. 9 and FIG. 10. FIG. 9 and FIG. 10 are diagrams illustrating the configuration of a reactor 4i according to the third embodiment. In the following, the explanation concentrates on the portions that are different from the second embodiment.

In the second embodiment, the common mode inductance value is adjusted by adjusting the overlapping area S of the first magnetic core 41 and the second magnetic core 42; however, in the third embodiment, the common mode inductance value is adjusted by adjusting the size of the gap G between a first magnetic core 41i and a second magnetic core 42i.

Specifically, in the reactor 4i of the noise filter 1i, the first magnetic core 41i further includes a second leg portion 41f. The second leg portion 41f is arranged on the first connection portion 41d on the side that is opposite to the leg portion 41b and extends in a direction substantially vertical to the first connection portion 41d and the leg portion 41b. For example, as illustrated in FIG. 10, the second leg portion 41f may be such that an end surface 41f1 is located toward the side of the second magnetic core 42i with respect to a side surface 41b2, which is on the side of the second magnetic core 42i, of the leg portion 41b.

The second magnetic core 42i does not include the arm portion 42a (see FIG. 2) and, for example, is substantially L shaped. The second magnetic core 42i is attached to the first magnetic core 41i such that it opposes the second leg portion 41f with the gap G therebetween and a closed magnetic path MPi, which passes through the leg portion 41b and the second leg portion 41f, is formed.

At this time, when the size of the gap G changes, the length of the closed magnetic path MPi formed by the first magnetic core 41i and the second magnetic core 42i changes and the permeability partially changes in the portion of the gap G between the first magnetic core 41i and the second magnetic core 42i; therefore, the common mode inductance value of the closed magnetic path MPi changes. In other words, the common mode inductance value of the closed magnetic path MPi can be adjusted by adjusting the size of the gap G.

For example, when the size of the gap G is reduced, the common mode inductance value increases and saturation becomes easy to occur. Alternatively, for example, when the size of the gap G is increased, the common mode inductance value decreases and saturation becomes difficult to occur.

The inductance value and the saturation characteristics can be adjusted in accordance with the situation on site; therefore, it is possible to cope with the noise problem under more various conditions.

As described above, in the third embodiment, in the noise filter 1i, the size of the gap G between the first magnetic core 41i and the second magnetic core 42i is adjusted such that the common mode inductance of the closed magnetic path MPi becomes an appropriate value. Consequently, the common mode inductance value can be adjusted without replacing the second magnetic core 42i with one having different characteristics and fine adjustment of the common mode inductance value can be easily performed.

Figure 11:
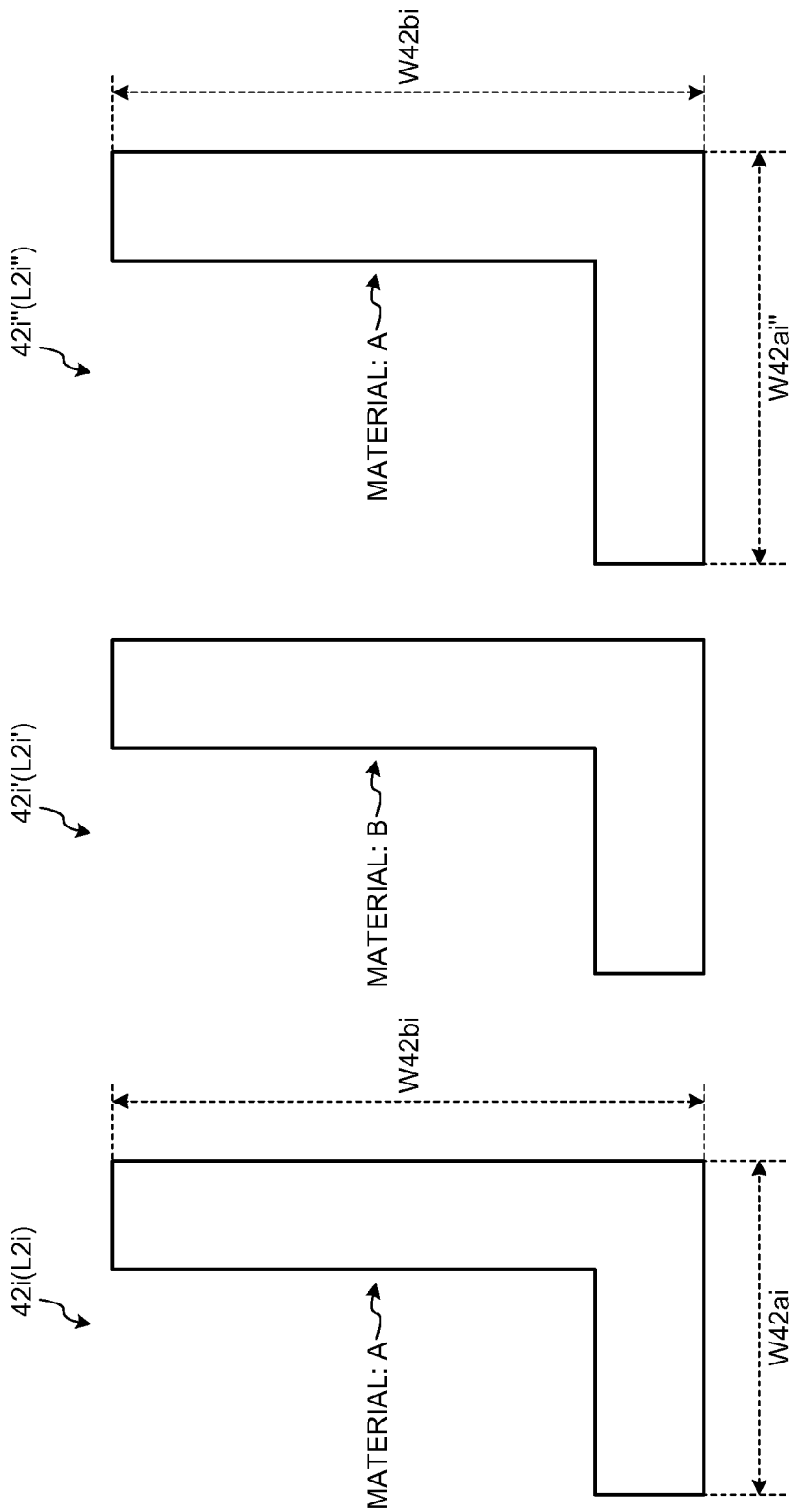
FIG. 11 is a diagram illustrating the configurations of second magnetic cores according to the third embodiment.

As illustrated in FIG. 11, a plurality of second magnetic cores 42i, 42i', and 42i", any of which have characteristics (for example, frequency characteristics and inductance value) different from each other, are prepared as a candidate for the substantially L-shaped second magnetic core 42i.

For example, as illustrated in FIG. 11, if any of the second magnetic cores 42i, 42i', and 42i " are made of a material different from the others, a common mode inductance in accordance with the required characteristics can be obtained. For example, in the case where the second magnetic core 42i is made of the material A and the second magnetic core 42i' is made of the material B, even if the second magnetic core 42i and the second magnetic core 42i are the same size, when the closed magnetic path MPi is formed, different inductance values L2i and L2i can be obtained. For example, if silicon steel is used as the material A, common mode noise having low frequency and large amplitude can be suppressed, and if a material having excellent frequency characteristics, such as ferrite, is used as the material B, common mode noise having a high frequency, such as noise, can be suppressed. In other words, the common mode inductance L2i corresponding to the second magnetic core 42i and the common mode inductance L2i " corresponding to the second magnetic core 42i " may be close in value; however, the frequency characteristics are different from each other. It is obvious that the inductance values may be made different from each other by changing the materials.

Alternatively, for example, as illustrated in FIG. 11, if any of the second magnetic cores 42i, 42i', and 42i " have a size different from the others, a common mode inductance in accordance with the required characteristics can be obtained. For example, when the dimensions of the second magnetic cores 42i and 42i" in the direction along the connection portion 42c are the same, i.e., W42bi, and the dimensions of the second magnetic cores 42i and 42i " in the direction along the arm portion 42b are different from each other, i.e., W42ai and W42ai", even if the second magnetic cores 42i and 42i" are made of the same material, i.e., the material A, when the closed magnetic path MPi is formed, different inductance values L2i and L2i" can be obtained. In other words, in terms of the common mode inductance L2i corresponding to the second magnetic core 42i and the common mode inductance L2i " corresponding to the second magnetic core 42i", when the closed magnetic path MPi is formed, the length of the closed magnetic path MPi is different; therefore, for example, even if the frequency characteristics are similar, the inductance values when the closed magnetic path MPi is formed are different from each other (for example, L2i>L2i").

Both the material and the dimension of any of the second magnetic cores 42i, 42i', and 42i" may be different from the others.

In this manner, a countermeasure against common mode noise can be easily taken by selecting an appropriate magnetic core from the second magnetic cores 42i, 42i', and 42i" in accordance with the noise problem on site.

Fourth Embodiment

Figure 12:
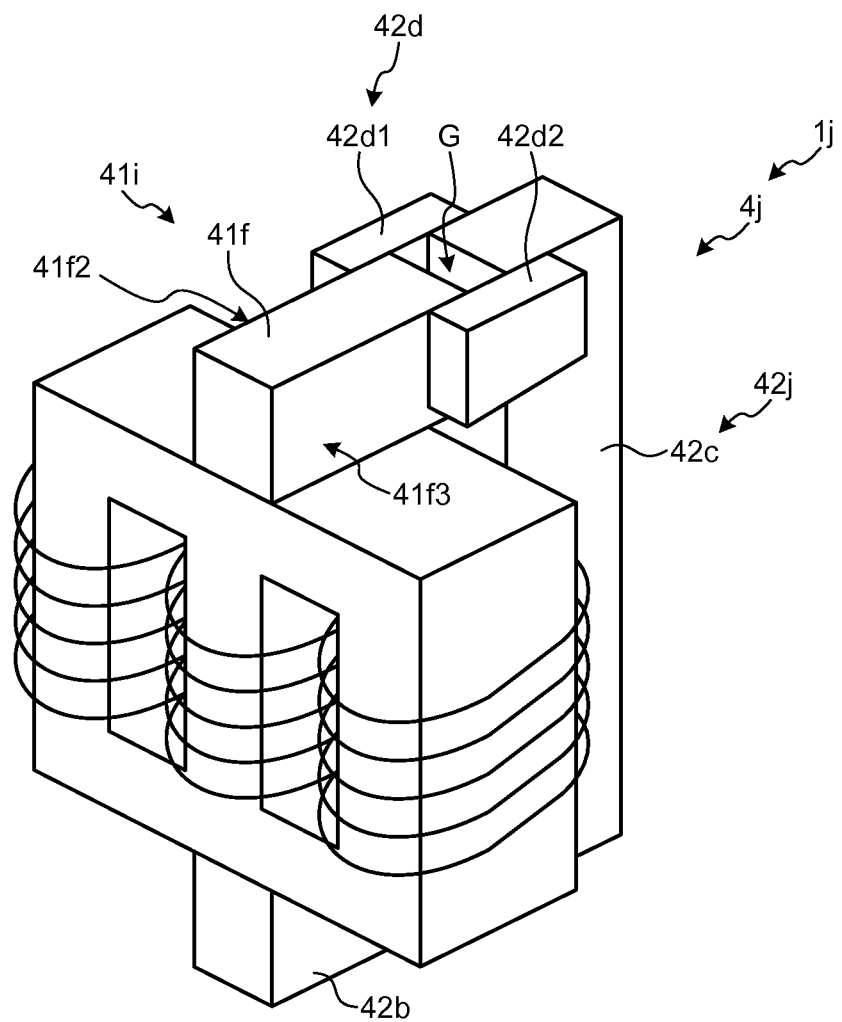
FIG. 12 is a diagram illustrating the configuration of a reactor according to a fourth embodiment.

Next, a noise filter 1j according to the fourth embodiment will be explained with reference to FIG. 12. FIG. 12 is a diagram illustrating the configuration of a reactor 4j according to the fourth embodiment. In the following, the explanation concentrates on the portions that are different from the third embodiment.

In the third embodiment, the method of fixing the second magnetic core 42i to the first magnetic core 41i is not given particular consideration. However, in view of the fact that when the size of the gap G changes, the common mode inductance value also changes, the second magnetic core 42i is preferably fixed to the first magnetic core 41i.

Thus, in the fourth embodiment, a structure is provided that is used to fix a second magnetic core 42j to the first magnetic core 41i. Specifically, as illustrated in FIG. 12, in the reactor 4j of the noise filter 1j, the second magnetic core 42j further includes a structural member 42d. The structural member 42d fixes the second magnetic core 42j to the second leg portion 41f from outside the gap G. For example, the structural member 42d includes a first plate 42d1 and a second plate 42d2. The first plate 42d1 and the second plate 42d2 are located opposite each other with a part (part near the upper end in FIG. 12) of the connection portion 42c, which is to oppose the second leg portion 41f, therebetween and are fixed to the connection portion 42c.

When the second magnetic core 42j is attached to the first magnetic core 41i, the first plate 42d1 and the second plate 42d2, for example, sandwich the second leg portion 41f from both side surfaces 41f2 and 41f3. Consequently, the first plate 42d1 and the second plate 42d2 fix the second magnetic core 42j to the second leg portion 41f from outside the gap G.

At this time, part of the magnetic flux that is to flow to the connection portion 42c from the second leg portion 41f may be diverted to the first plate 42d1 and the second plate 42d2. For example, if the first plate 42d1 and the second plate 42d2 are made of the same material as that of the connection portion 42c and the arm portion 42b, the magnetic flux that is to flow to the connection portion 42c from the second leg portion 41f can be diverted to the first plate 42d1 and the second plate 42d2. In other words, the structural member 42d may be caused to function as part of the core to form the closed magnetic path MPi (see FIG. 10).

At this time, the magnetic flux that was not diverted in the magnetic flux that is to flow to the connection portion 42c from the second leg portion 41f flows to the connection portion 42c from the second leg portion 41f via the gap G. Therefore, when the size of the gap G changes, the length of the closed magnetic path MPi formed by the first magnetic core 41i and the second magnetic core 42j changes and the permeability partially changes in the portion of the gap G between the first magnetic core 41i and the second magnetic core 42j; therefore, the common mode inductance value of the closed magnetic path MPi changes. In other words, the common mode inductance value of the closed magnetic path MPi can be adjusted by adjusting the size of the gap G.

For example, when the size of the gap G is reduced, the common mode inductance value increases and saturation becomes easy to occur. Alternatively, for example, when the size of the gap G is increased, the common mode inductance value decreases and saturation becomes difficult to occur.

As described above, in the fourth embodiment, the structural member 42d of the second magnetic core 42j fixes the second magnetic core 42j to the second leg portion 41f of the first magnetic core 41i from outside the gap G. Consequently, the size of the gap G between the first magnetic core 41i and the second magnetic core 42j can be stably maintained at an appropriate value.

Fifth Embodiment

Figure 13:
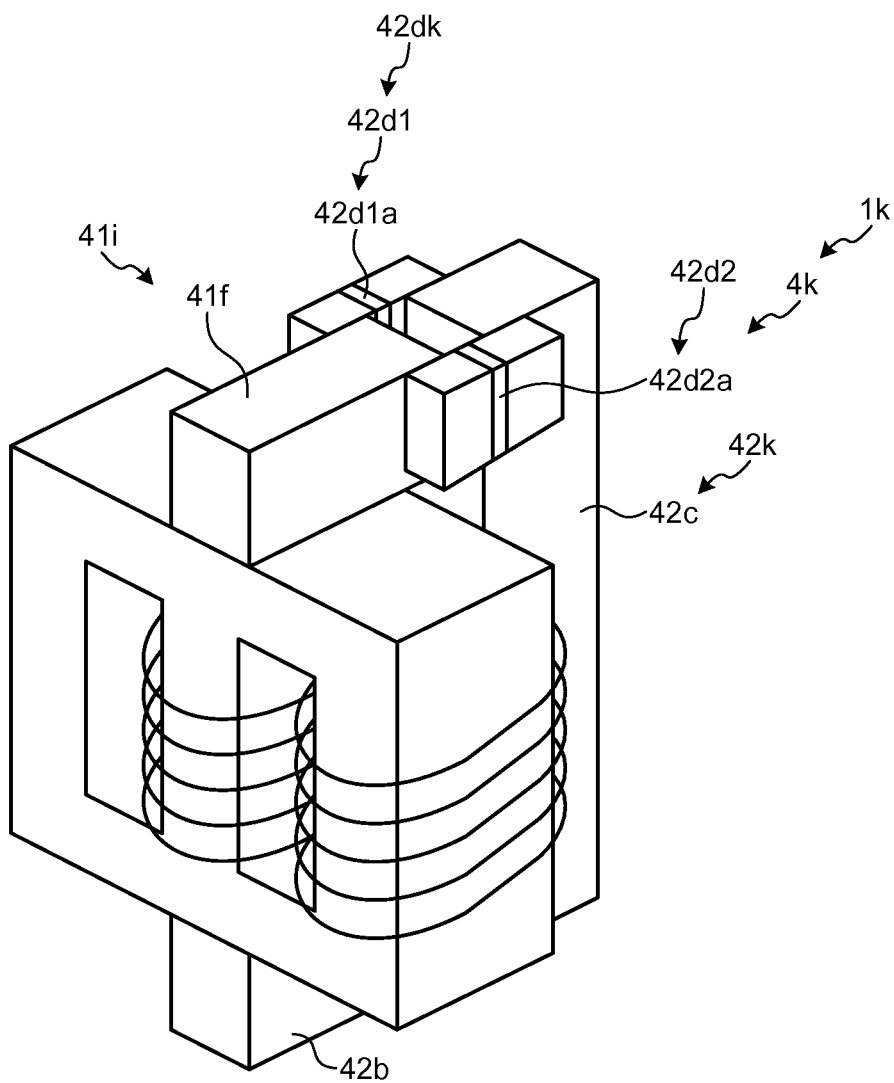
FIG. 13 is a diagram illustrating the configuration of a reactor according to a fifth embodiment.

Next, a noise filter 1k according to the fifth embodiment will be explained with reference to FIG. 13. FIG. 13 is a diagram illustrating the configuration of a reactor 4k according to the fifth embodiment. In the following, the explanation concentrates on the portions that are different from the fourth embodiment.

In the fourth embodiment, part of the magnetic flux that is to flow to the connection portion 42c from the second leg portion 41f is diverted to the structural member 42d (the first plate 42d1 and the second plate 42d2). In the fifth embodiment, diversion of the magnetic flux to the structural member 42d is suppressed.

Specifically, as illustrated in FIG. 13, in the reactor 4k of the noise filter 1k, a structural member 42dk of a second magnetic core 42k includes a non-magnetic body. For example, the first plate 42d1 includes a non-magnetic layer 42d1a that extends to intersect with the direction in which the magnetic flux is to be diverted. The non-magnetic layer 42d1a increases the magnetic resistance of the first plate 42d1 so that the magnetic flux does not easily pass through the first plate 42d1. For example, the second plate 42d2 includes a non-magnetic layer 42d2a that extends to intersect with the direction in which the magnetic flux is to be diverted. The non-magnetic layer 42d2a increases the magnetic resistance of the second plate 42d2 so that the magnetic flux does not easily pass through the second plate 42d2.

At this time, most of the magnetic flux that is to flow to the connection portion 42c from the second leg portion 41f flows to the connection portion 42c from the second leg portion 41f via the gap G. Therefore, when the size of the gap G changes, the length of the closed magnetic path MPi formed by the first magnetic core 41i and the second magnetic core 42k changes and the permeability partially changes in the portion of the gap G between the first magnetic core 41i and the second magnetic core 42k; therefore, the common mode inductance value of the closed magnetic path MPi changes. In other words, the common mode inductance value of the closed magnetic path MPi can be adjusted by adjusting the size of the gap G.

For example, when the size of the gap G is reduced, the common mode inductance value increases and saturation becomes easy to occur. Alternatively, for example, when the size of the gap G is increased, the common mode inductance value decreases and saturation becomes difficult to occur.

As described above, in the fifth embodiment, the structural member 42dk of the second magnetic core 42k fixes the second magnetic core 42k to the second leg portion 41f of the first magnetic core 41i from outside the gap G. Consequently, the size of the gap G between the first magnetic core 41i and the second magnetic core 42k can be stably maintained at an appropriate value.

Moreover, in the fifth embodiment, the structural member 42dk includes a non-magnetic body; therefore, most of the magnetic flux that is to flow to the connection portion 42c from the second leg portion 41f can be caused to flow to the connection portion 42c from the second leg portion 41f via the gap G. Consequently, the common mode inductance value can be efficiently adjusted compared with the case where part of the magnetic flux that is to flow to the connection portion 42c from the second leg portion 41f is diverted to the structural member 42dk.

Sixth Embodiment

Figure 14:
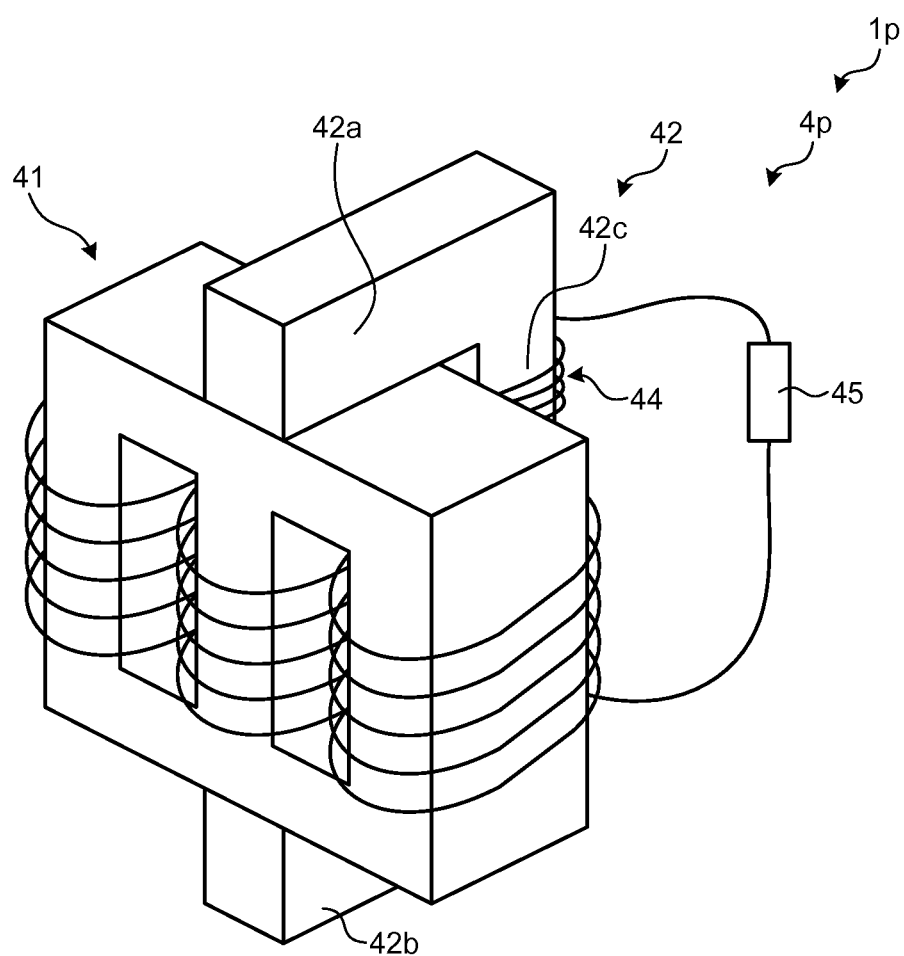
FIG. 14 is a diagram illustrating the configuration of a reactor according to a sixth embodiment.

Next, a noise filter 1p according to the sixth embodiment will be explained with reference to FIG. 14. FIG. 14 is a diagram illustrating the configuration of a reactor 4p according to the sixth embodiment. In the following, the explanation concentrates on the portions that are different from the first embodiment.

In the first embodiment, the vibration component of common mode noise is not given particular consideration. In the sixth embodiment, the vibration component of common mode noise is suppressed by adding a damping element to the common mode circuit (the closed magnetic path MP illustrated in FIG. 4).

Specifically, as illustrated in FIG. 14, the reactor 4p of the noise filter 1p further includes a second coil 44 and a resistor 45. The second coil 44 is wound on the second magnetic core 42. For example, the second coil 44 is wound on the connection portion 42c. The resistor 45 is electrically connected to both ends of the second coil 44.

A damping element can be added to the common mode circuit (the closed magnetic path MP illustrated in FIG. 4) by attaching the second coil 44 and the resistor 45 to the second magnetic core 42. In other words, when the resistor 45 is electrically connected to both ends of the second coil 44 wound on the second magnetic core 42, the configuration becomes such that the resistor 45 is inserted into the common mode circuit equivalently; therefore, damping is exerted due to the loss generated by the resistor 45. Consequently, the vibration component of common mode noise can be damped at an early stage and thus the amount of common mode noise can be reduced.

As described above, in the sixth embodiment, the second coil 44 is wound on the second magnetic core 42 and the resistor 45 is electrically connected to both ends of the second coil 44. Consequently, a damping element can be added to the common mode circuit (the closed magnetic path MP illustrated in FIG. 4). Thus, the vibration component of common mode noise can be damped at an early stage and thus the amount of common mode noise can be reduced.

Seventh Embodiment

Figure 15:
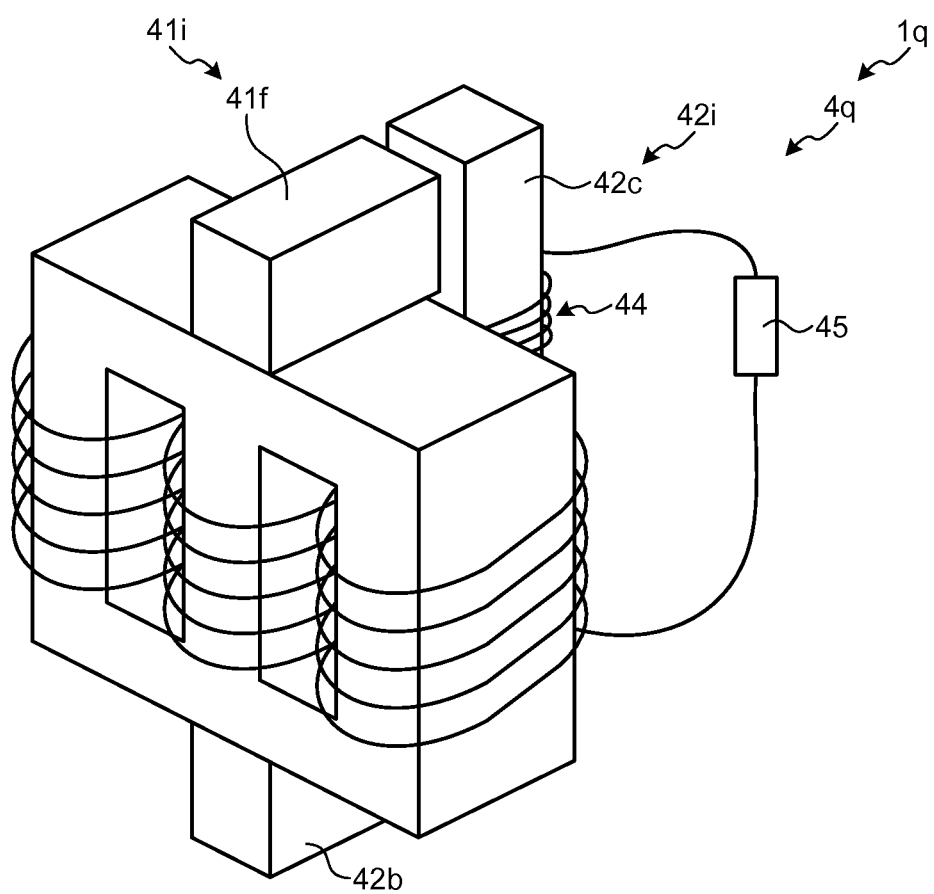
FIG. 15 is a diagram illustrating the configuration of a reactor according to a seventh embodiment.

Next, a noise filter 1q according to the seventh embodiment will be explained with reference to FIG. 15. FIG. 15 is a diagram illustrating the configuration of a reactor 4q according to the seventh embodiment. In the following, the explanation concentrates on the portions that are different from the third embodiment.

In the third embodiment, the vibration component of common mode noise is not given particular consideration. In the seventh embodiment, the vibration component of common mode noise is suppressed by adding a damping element to the common mode circuit (the closed magnetic path MPi illustrated in FIG. 10).

Specifically, as illustrated in FIG. 15, the reactor 4q of the noise filter 1q further includes the second coil 44 and the resistor 45. The second coil 44 is wound on the second magnetic core 42i. For example, the second coil 44 is wound on the connection portion 42c. The resistor 45 is electrically connected to both ends of the second coil 44.

A damping element can be added to the common mode circuit (the closed magnetic path MPi illustrated in FIG. 10) by attaching the second coil 44 and the resistor 45 to the second magnetic core 42i. In other words, when the resistor 45 is electrically connected to both ends of the second coil 44 wound on the second magnetic core 42i, the configuration becomes such that the resistor 45 is inserted into the common mode circuit equivalently; therefore, damping is exerted due to the loss generated by the resistor 45. Consequently, the vibration component of common mode noise can be damped at an early stage and thus the amount of common mode noise can be reduced.

As described above, in the seventh embodiment, the second coil 44 is wound on the second magnetic core 42i and the resistor 45 is electrically connected to both ends of the second coil 44. Consequently, a damping element can be added to the common mode circuit (the closed magnetic path MPi illustrated in FIG. 10). Thus, the vibration component of common mode noise can be damped at an early stage and thus the amount of common mode noise can be reduced.

Industrial Applicability

As described above, the noise filter according to the present invention is useful for reducing common mode noise.

Reference Signs List 1, 1*i*, 1*j*, 1*k*, 1*p*, 1*q* noise filter, 3 capacitor, 3A to 3C line-to-line capacitor, 4, 4*i*, 4*j*, 4*k*, 4*p*, 4*q* reactor, 4A normal mode inductance, 4B common mode inductance, 41, 41*i* first magnetic core, 41*a* to 41*c* leg portion, 41*d* first connection portion, 41*e* second connection portion, 41*f* second leg portion, 42, 42', 42", 42*i*, 42*j* second magnetic core, 42*a*, 42*b* arm portion, 42*c* connection portion, 42*d*, 42*dk* structural member, 43*a* to 43*c* coil, 804 normal mode reactor, 904 common mode reactor

The invention claimed is:

1. A noise filter comprising:
a first magnetic core that includes a plurality of leg portions, and a first connection portion and a second connection portion, which are respectively connected to first-side ends and opposite-side ends of the plurality of leg portions;
a plurality of coils that are wound on the plurality of leg portions, respectively; and
a second magnetic core that is configured to be attachable to and detachable from the first magnetic core such that a closed magnetic path, which intersects with each of the first connection portion and the second connection portion and which passes through the plurality of leg portions, is formed, wherein
the first magnetic core includes a normal mode inductance,
the closed magnetic path includes a common mode inductance,
wherein the common mode inductance is modified by adjusting a position at which the second magnetic core is attached to the first magnetic core,
the second magnetic core is substantially U shaped,
the second magnetic core is attached to the first magnetic core such that the second magnetic core sandwiches the plurality of leg portions, the first connection portion, and the second connection portion at two outer sides of the first magnetic core, and
an overlapping area of the first magnetic core and the second magnetic core when seen through in a longitudinal direction of the plurality of leg portions is adjusted such that the common mode inductance of the closed magnetic path is modified.

2. A noise filter comprising:
a first magnetic core that includes a plurality of leg portions, and a first connection portion and a second connection portion, which are respectively connected to first-side ends and opposite-side ends of the plurality of leg portions;
a plurality of coils that are wound on the plurality of leg portions, respectively; and
a second magnetic core that is configured to be attachable to and detachable from the first magnetic core such that a first closed magnetic path, which intersects with each of the first connection portion and the second connection portion and which passes through the plurality of leg portions, is formed, wherein
the first magnetic core includes a normal mode inductance,
the first closed magnetic path includes a common mode inductance,
wherein the common mode inductance is modified by adjusting a position at which the second magnetic core is attached to the first magnetic core,
the second magnetic core is substantially L shaped,
the first magnetic core further includes a second leg portion that is arranged on the first connection portion on a side that is opposite to the plurality of leg portions and extends in a direction substantially vertical to the first connection portion and the plurality of leg portions,
the second magnetic core is attached to the first magnetic core such that the second magnetic core opposes the second leg portion with a gap therebetween and a second closed magnetic path, which passes through the plurality of leg portions and the second leg portion, is formed, and
a size of the gap is adjusted to modify the common mode inductance of the second closed magnetic path.

3. The noise filter according to claim 2, wherein the second magnetic core further includes a structural member that fixes the second magnetic core to the second leg portion from outside the gap.

4. The noise filter according to claim 3, wherein the structural member includes a non-magnetic body.

* * * * *